United States Patent [19]

Shen et al.

[11] Patent Number: 5,191,243

[45] Date of Patent: Mar. 2, 1993

[54] OUTPUT LOGIC MACROCELL WITH ENHANCED FUNCTIONAL CAPABILITIES

[75] Inventors: Ju Shen, San Jose; Albert L. Chan, Palo Alto; Kapil Shankar, San Jose, all of Calif.; Cyrus Tsui, Vancouver, Wash.

[73] Assignee: Lattice Semiconductor Corporation, Hillsboro, Oreg.

[21] Appl. No.: 696,907

[22] Filed: May 6, 1991

[51] Int. Cl.⁵ .................................. H03K 19/177
[52] U.S. Cl. ............................ 307/465; 307/243; 307/471; 307/480
[58] Field of Search .................... 307/465–469, 307/243, 471, 480

[56] References Cited

U.S. PATENT DOCUMENTS

| | | | |
|---|---|---|---|
| 4,758,746 | 7/1988 | Birkner et al. | 307/465 |
| 4,789,951 | 12/1988 | Birkner et al. | 307/465 X |
| 4,879,481 | 11/1989 | Pathale et al. | 307/465 |
| 4,896,296 | 1/1990 | Turner et al. | 307/465 X |
| 4,912,342 | 3/1990 | Wong et al. | 307/465 |
| 4,912,345 | 3/1990 | Steele et al. | 307/468 X |
| 4,918,641 | 4/1990 | Jigour et al. | 307/465 X |

*Primary Examiner*—David Hudspeth
*Attorney, Agent, or Firm*—Skjerven, Morrill, MacPherson, Franklin & Friel

[57] ABSTRACT

An output logic macrocell ("OLMC") containing an exclusive OR gate is associated with the product terms and other outputs of a logic block such as a programmable logic array. The OLMC is capable of providing enhanced functions, including cascaded exclusive OR gates, function sharing, T and J-K flip-flop emulation, asynchronous clocking, and a reset selection. In addition, a logic block is used as the source of an asynchronous clock pulse and is connected to the global clock distribution system of a device such as a high density programmable logic device.

25 Claims, 6 Drawing Sheets

OUTPUT LOGIC MACROCELL WITH ENHANCED FUNCTIONAL CAPABILITIES

FIELD OF THE INVENTION

This invention relates to programmable logic arrays and other types of logic blocks, and in particular to an output logic macrocell ("OLMC") suitable for use with a logic block and having enhanced functional capabilities.

BACKGROUND OF THE INVENTION

Logic blocks such as programmable logic arrays are well known. U.S. Pat. No. 4,124,899, for example, describes both the background and the uses of programmable logic arrays and field programmable logic arrays. A typical programmable logic array comprises a plurality of inputs leading through an AND array to a set of AND gates. The outputs of the AND gates, referred to as "product terms", feed through an OR array to a set of OR gates. The outputs of the OR gates are essentially the outputs of the programmable logic array, although as described herein the product terms may also be used as outputs and the outputs may be sent through an output cell where they are manipulated in various ways.

The typical AND-OR form of a programmable logic array is somewhat limiting. Certain capabilities are not easily available in the AND-OR form, such as cascade exclusive OR ("XOR") functions, asynchronous register control and clocking, and the emulation of T-type and J-K type flip-flop functions. These functions are useful in programming the array to perform as a comparator, counter, parity generator or arithmetic logic unit. With a typical AND-OR array, designing devices such as these is difficult and uses up a considerable amount of valuable logic resources within the array.

Figure 1:
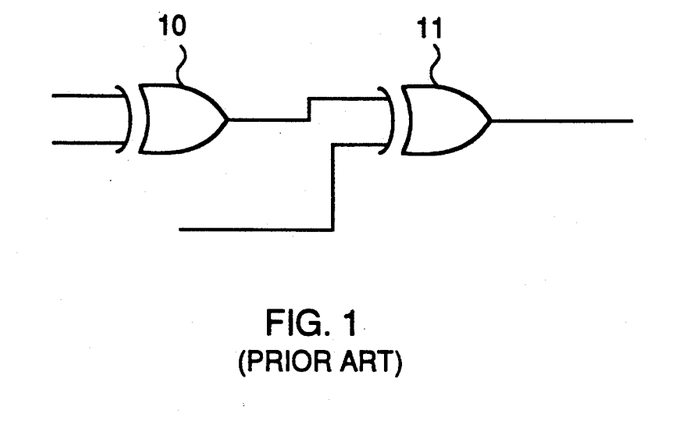
FIG. 1 illustrates a cascaded XOR arrangement.

As an example, a cascaded XOR arrangement such as shown in FIG. 1 is very useful in designing arithmetic logic units and parity generators. FIG. 1 shows an XOR gate 10, the output of which feeds an input of an XOR gate 11. A typical AND-OR programmable logic array does not contain an XOR gate. Therefore, if an XOR gate is required, it must be simulated using the AND-OR structure shown in FIG. 2, wherein the outputs of two AND gates 20 and 21 feed the inputs of an OR gate 22. This simulates only a single XOR gate. If a pair of cascaded XOR gates is required, two such arrangements are required. Since an ordinary AND-OR programmable logic array includes only a single set of AND gates feeding a single set of OR gates, this requires that the output of the first simulated XOR gate be fed back through the array again, thereby using up a considerable amount of the limited number of AND and OR gates available in the array.

SUMMARY OF THE INVENTION

This invention provides an output logic macrocell for use with a logic block such as a programmable logic array. The output logic macrocell contains an XOR gate, an OR gate, a register, and a plurality of multiplexers connected up in such a way as to provide enhanced functional capabilities to the programmer, including cascaded XOR gates, function sharing with another OLMC, and asynchronous register control and clocking. In addition, inputs of a plurality of OLMC's are linked to the product terms and other outputs of the logic block through a product term allocation array, thereby allowing maximum flexibility in the distribution of the outputs of the logic block to the respective OLMC's and allowing the performance of extremely complex functions.

One of the multiplexers in each OLMC has an output connected to an input of the XOR gate. One input of this multiplexer is connected to ground. When the grounded input is selected, the XOR gate simply passes the signal appearing at its other input. In effect, the XOR gate is taken out of the circuit.

The OLMC also includes a bypass path which bypasses the XOR and OR gates and thereby provides extremely fast performance. The OLMC provides either a registered or an combinatorial output.

In another aspect of this invention, a logic block is used to generate a clock pulse. The output of the logic block "clock" is connected to the global clock distribution system of this high density programmable logic device, as well as to input/output cell clocks in the device.

This invention will be more fully understood in conjunction with the following detailed description taken together with the drawings.

DESCRIPTION OF THE INVENTION

The following description of this invention is meant to be illustrative only and not limiting. Others skilled in the art may be able to implement other embodiments of this invention based on the following descriptions.

Figure 3:
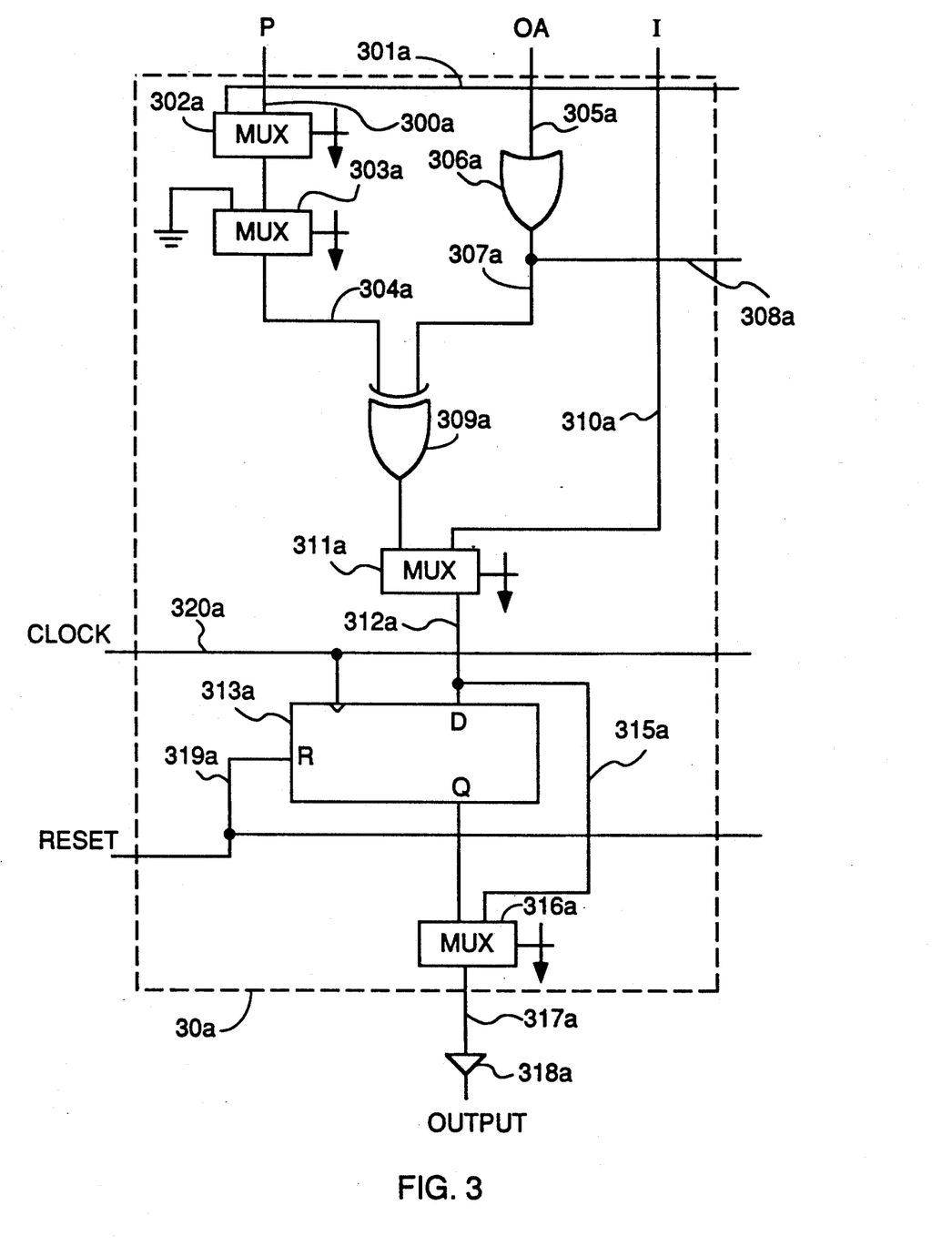
FIG. 3 illustrates an output logic macrocell of this invention.
Figure 4A:
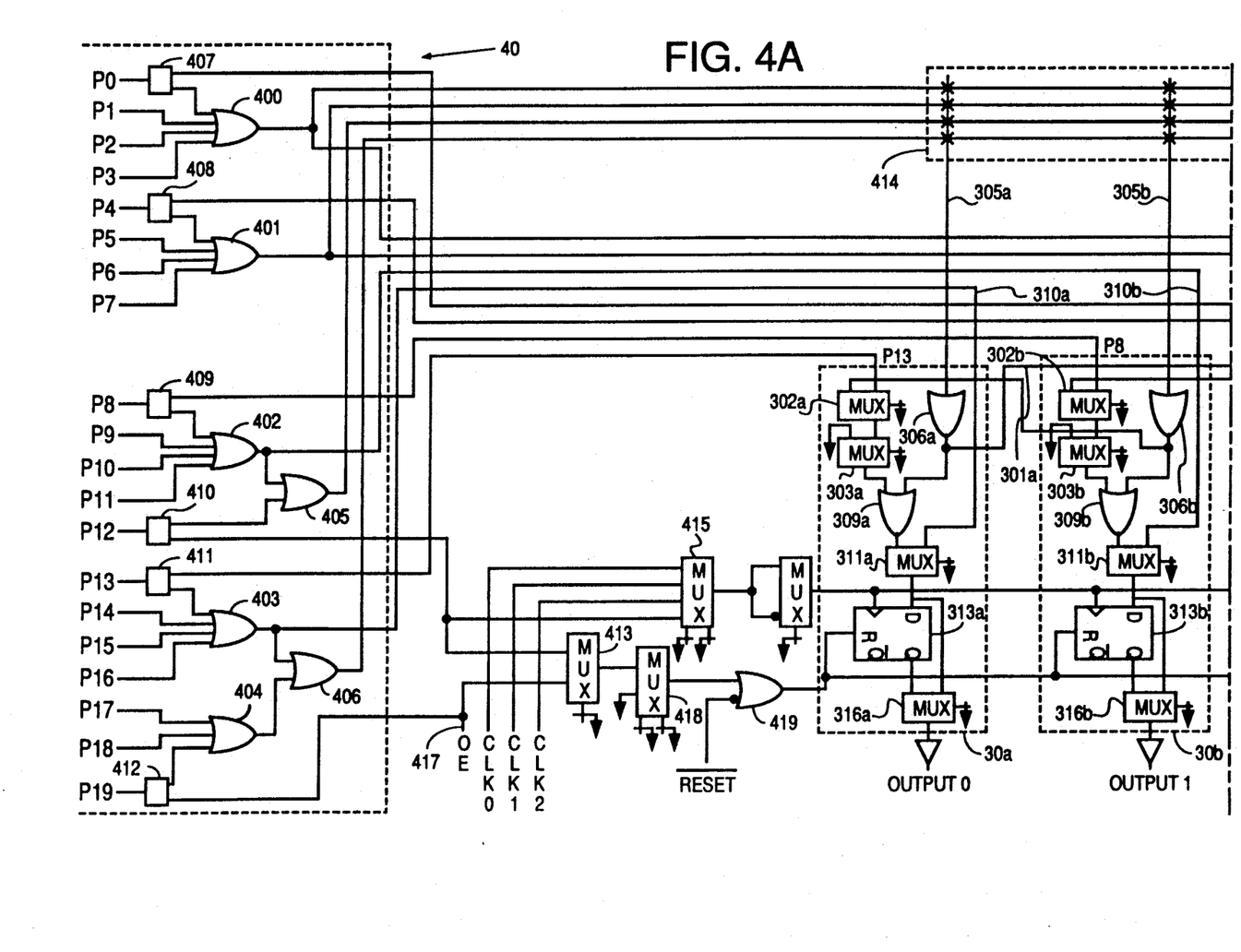
FIGS. 4A–4B illustrates a plurality of output logic macrocells of this invention, showing the manner in which they may be connected to the outputs of a programmable logic array and to various other inputs.
Figure 4B:
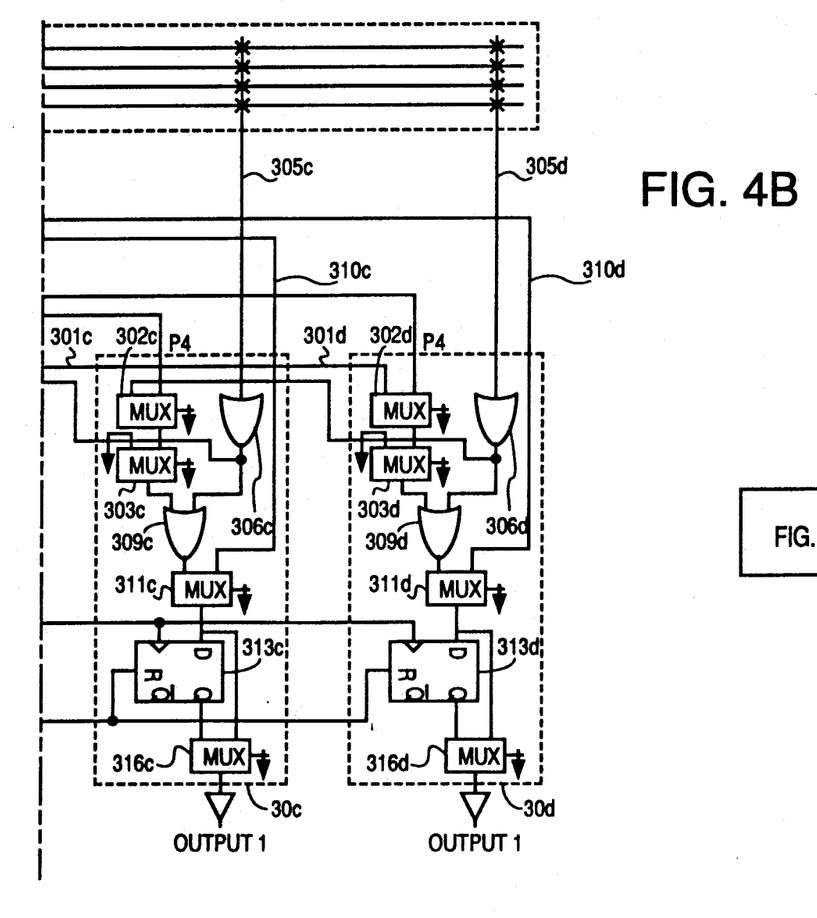

FIG. 3 shows an output logic macrocell ("OLMC") 30a of this invention. OLMC 30a has three inputs: an input P which comes from a product term of a programmable logic array; an input OA which comes from a programmable product term allocation array which is connected to the outputs of a programmable logic array; and an input I which is connected directly to an output of the programmable logic array. The exact manner in which these inputs are connected will be described in conjunction with FIG. 4.

Input P is connected to one input of a multiplexer 302a. Multiplexers 302a, 303a, 311a and 316a are all programmable multiplexers which can be programmed to have either of their states selected. A second input of multiplexer 302a is connected through a line 301a to a line of another OLMC which is comparable to line 308a of OLMC 30a. The output of multiplexer 302a is connected to one input of a multiplexer 303a, the other input of which is grounded. The output of multiplexer 303a feeds an input of an exclusive OR ("XOR") gate 309a. Input OA feeds through an OR gate 306a to the other input of XOR gate 309a. The output of OR gate 306a is also connected to line 308a which, as described above, is connected to a line comparable to line 301a in a neighboring OLMC.

The output of XOR gate 309a flows to one input of a multiplexer 311a. Input I is directed to the other input of multiplexer 311a. The output of multiplexer 311a leads to the input of a D-type flip-flop 313a. The output of flip-flop 313a is applied to an input of a multiplexer 316a, the other input of which is connected over a line 315a to the output of multiplexer 311a. The output of multiplexer 316a is fed through a buffer 318a, the output of which is the output of OLMC 30a.

A clock pulse is sent to the clock input of flip-flop 313a over a line 320a which also leads to similar D-type flip-flops in other OLMC's. A reset signal is applied over line 319a to the reset terminal of flip-flop 313a and likewise is sent to the reset terminals of similar flip-flops in other OLMC's.

FIG. 4 shows the manner in which four OLMC's 30a, 30b, 30c and 30d are connected to a programmable logic array 40. Programmable logic array 40, only the output portion of which is shown in FIG. 4, is an AND-OR programmable logic array of the type illustrated in FIG. 1 of application U.S. Ser. No. 07/696,462, co-owned and concurrently filed herewith, which is incorporated herein by reference. Programmable logic arrays such as programmable logic array 40 often function in combination with other programmable logic arrays as logic blocks in a more complex device such as the high density programmable logic device (HDPLD) illustrated in FIG. 4 of the above-named application.

Lines P0 through P19 represent the product terms of programmable logic array 40. Product terms P0–P3 lead to the inputs of an OR gate 400; product terms P4–P7 lead to the inputs of an OR gate 401; product terms P8–P11 lead to the inputs of an OR gate 402; product terms P13–P16 lead to the inputs of an OR gate 403; and product terms P17–P19 lead to the inputs of an OR gate 404. Product term P0 feeds through a multiplexer 407 which permits it to be connected alternatively to the P0 input of OLMC 30d. Product term P4 feeds through a multiplexer 408 which allows it to be connected alternatively to the P4 input of OLMC 30c. Product term P8 feeds through a multiplexer 409 which alternatively allows it to be connected to the P8 input of OLMC 30b. Product term P13 feeds through a multiplexer 411 which alternatively allows it to be connected to the P13 input of OLMC 30a.

Product term P12 feeds a multiplexer 410. One output of multiplexer 410 feeds an input of an OR gate 405, the other input of which is connected to the output of OR gate 402. The other output of multiplexer 410 is connected to an input of a multiplexer 413. Product term P19 feeds a multiplexer 412. One output of multiplexer 412 leads to an input of OR gate 404. The other output of multiplexer 412 leads to an input of multiplexer 413.

Accordingly, the four primary outputs of the programmable logic array are the respective outputs of OR gates 400, 401, 405 and 406. Depending on the state of multiplexers 407–412, product terms P0, P4, P8, P12, P13 and P19, respectively, may or may not be included in the OR functions provided by OR gates 400, 401, 405 and 406. The outputs of OR gates 400, 401, 405 and 406 are connected into a product term allocation array 414. Product term allocation array 414 contains a complete array of programmable connections which allow the outputs of OR gates 400, 401, 405 and 406 to be OR'd in any combination in OR gates 306a–306d of OLMC's 30a–30d. Product term allocation array 414 is described more fully in application U.S. Ser. No. 07/696,461, co-owned and filed concurrently herewith, which is incorporated herein by reference.

The outputs of OR gates 400 and 401 are also connected to lines 310d and 310c in OLMC's 30d and 30c, respectively, as well as leading to array 414. The outputs of OR gates 402 and 403 are also connected to lines 310b and 310a in OLMC's 30b and 30a, respectively, as well as being connected to inputs of OR gates 405 and 406, respectively.

Global clock pulse lines CLK0, CLK1 and CLK2 are directed to the inputs of a 4-way multiplexer 415, the fourth input of which is connected to product term P12 through multiplexer 410. The output of multiplexer 415 and its complement are directed to the inputs of a multiplexer 416, the output of which is sent to the clock terminals of registers 313a–313d.

Product terms P12 and P19 may flow through multiplexers 410 and 412, respectively to the inputs of multiplexer 413. The output of multiplexer 413 leads to an input of a multiplexer 418, the other input of which is grounded. The output of multiplexer 418 is OR'd in an OR gate 419 with the complement of a reset signal, and the output of OR gate 419 is passed to the respective reset
terminals of flip-flops 313a–313d.

Figure 5:
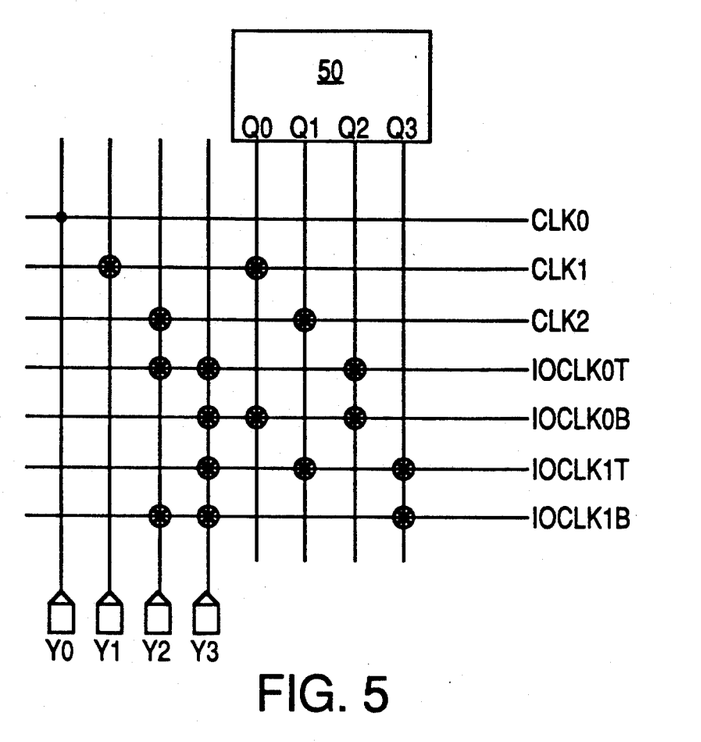
FIG. 5 illustrates a logic block "clock" and a clock distribution network in accordance with another aspect of the invention.

Clock lines CLK0, CLK1 and CLK2 may be connected into a clock distribution network of the kind shown in FIG. 5. In FIG. 5, logic block 50 comprises a programmable logic array having four inputs Q0, Q1, Q2 and Q3. Logic block 50 may be one of a plurality of logic blocks which is selected to provide an internal clock pulse and which may function otherwise as an ordinary logic block. Pins Y0, Y1, Y2 and Y3 are dedicated input pins for the programmable logic device (e.g., an HDPLD) of which the arrangements shown in FIGS. 4 and 5 are a part. Lines IOCLK0T, IOCLK0B, IOCLK1T and IOCLK1B are clock lines which lead to input/output (I/0) cells in the device, one embodiment of which is described below in conjunction with FIG. 6. Lines IOCLK0T and IOCLK1T lead to I/0 cells on one side of the device, and pins IOCLK0B and IOCLK1B lead to I/0 cells on the other side of the device. Each I/0 cell has a multiplexer capable of selecting one of the clock pulses delivered to that cell. Lines CLK0, CLK1 and CLK2 are global clock lines for the entire device.

In FIG. 5, pin Y0 is hard-wired to CLK0 and is the main system clock. Line CLK1 may be connected with either pin Y1 or output Q0 of logic block 50. Line CLK2 may be connected with either pin Y2 or output Q1 of logic block 50. Lines IOCLK0T, IOCLK0B, IOCLK1T and IOCLK1B may not be connected to either of pins Y0 or Y1 but may be connected to pins Y2 and Y3 and outputs Q0–Q3 in the manner shown.

Figure 6:
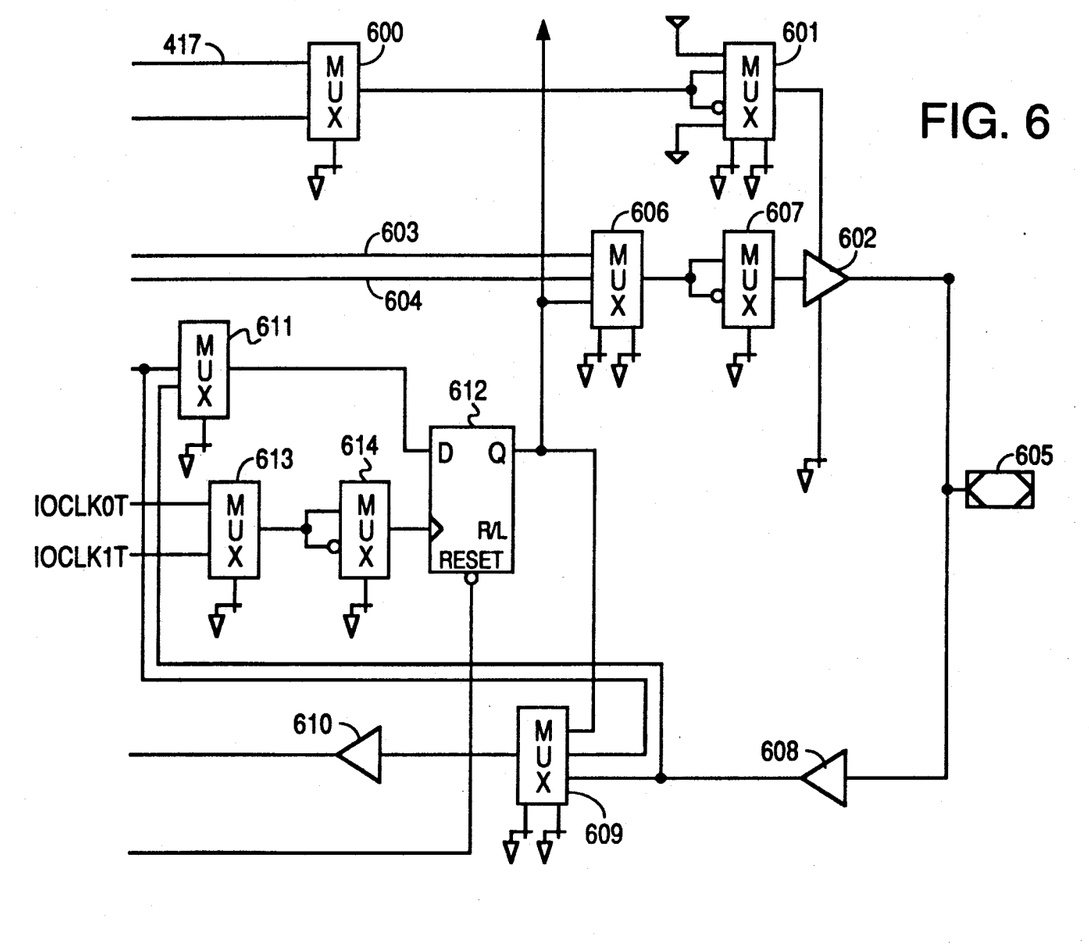
FIG. 6 illustrates an input/output cell.

Referring again to FIG. 4, product term P19 may be connected via multiplexer 412 to a line 417 which runs to an I/0 cell such as is shown in FIG. 6. Line 417 carries the output enable signal. Referring to FIG. 6, output enable line 417 is fed through a multiplexer 600 and a multiplexer 601, which permits the true or complementary signal to be selected. The output of multiplexer 601 is connected to the control terminal of a tri-stable buffer 602. When tri-stable 602 buffer is enabled by a signal on line 417, it passes the output signal on line 603 or line 604 to an I/0 pin 605. Lines 603 or 604 are selected by a multiplexer 606, and a multiplexer 607 allows the true signal or its complement to be selected for transmission by pin 605.

When tri-stable buffer 602 is disabled by the signal on line 417, pin 605 functions as an input pin. In this mode, tri-stable buffer 602 acts as an open circuit, and the side connected to pin 605 floats. The input signal passes from pin 605 through a buffer 608 to a multiplexer 609. If multiplexer 609 is appropriately set, the signal will pass through a buffer 610 to input connections within the device. Alternatively, the input signal is routed to a multiplexer 611 and to a register/latch 612. In register/latch 612 the input signal may be registered or latched before it passes through multiplexer 609 to internal connections within the device. Lines IOCLKOT and IOCLKOT come from the clock distribution network (FIG. 5) and the clock pulse on one of them passes through a multiplexer 613 and a true/complementary selection multiplexer 614 to the clock terminal of register/latch 612.

The following are illustrative of the wide variety of functions that OLMC's 30a-30d may perform when connected in the manner shown in FIGS. 4, 5 and 6.

1. Cascaded XOR Gates

Figure 2:
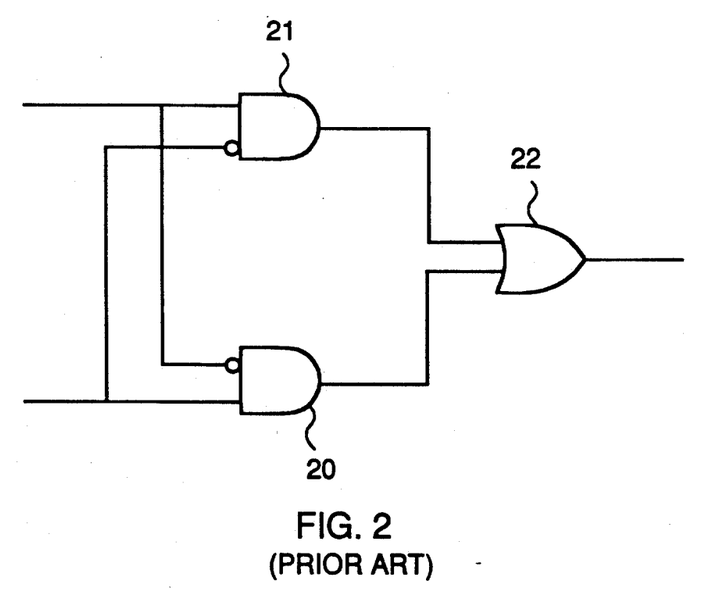
FIG. 2 illustrates the structure of AND and OR gates required to simulate the operation of an XOR gate.

To provide a cascaded XOR gate arrangement, as illustrated in FIG., XOR gate 10 is simulated in the programmable logic array by the AND-OR gate arrangement shown in FIG. 2. Thus, the programmable logic array is programmed such that two of the AND gates are connected with an OR gate as shown in FIG. 2.

For example, OR gate 400 could be selected as the counterpart of OR gate 22. The output of OR gate 400 leads to product term allocation array 414. Array 414 is programmed so as to send the output of OR gate 400 over line 305a to an input of OR gate 306a in OLMC 30a. OR gate 306a passes the signal on line 305a to an input of XOR gate 309a.

Multiplexer 411 is programmed to allow the signal on product term P13 to flow to an input of multiplexer 302a, which is programmed to pass this signal to an input of multiplexer 303a, which sends the signal to the second input of XOR gate 309a. Thus, XOR gate 309a functions as the counterpart to XOR gate 11 in FIG. 1.

Alternatively, by making appropriate connections with line 305a in array 414, OR gate 306a may be included with one or more of OR gates 400-406 in forming the counterpart to OR gate 22 in FIG. 2, which feeds XOR gate 309a.

The output of XOR gate 309a is routed through multiplexer 311a to an input of register 313a, and the registered signal is sent by multiplexer 316a to Output 0 of OLMC 30a. Alternatively, if a combinatorial output is desired, multiplexer 316a can be programmed to be connected directly to the output of multiplexer 311a.

The cascaded XOR gate function is extremely useful in such applications as counters, arithmetic logic units, parity generators and comparators.

2. Asynchronous Clock Pulse

The signal on product term P12 may be directed through multiplexer 410 and multiplexer 415 to either the true or complementary input of multiplexer 416. From multiplexer 416 it is sent to the clock inputs of register 313a-313d. In this manner, an asynchronous clock pulse can be used to drive registers 313a-313d by providing whatever signal is desired on product term P12. Alternatively, multiplexer 415 can be programmed to pass the global clock pulses on lines CLK0, CLK1 or CLK2, which may be synchronous global clock pulses originating from outside sources. The possible sources of the signals on lines CLK0, CLK1 AND CLK2 are described further below in the description of the internal clocking scheme.

Thus, register 313a may be clocked synchronously using global clock pulses or asynchronously using a clock pulse on product term P12. Either polarity of clock pulses may be selected by means of multiplexer 415. The asynchronous clock pulse can be a logic function of the inputs to the programmable logic array. By programming multiplexer 410 appropriately, product term P12 can be used either for logic functions or for providing an asynchronous clock pulse.

3. Reset Selection

The signal on product term P12 or P19 may be passed through multiplexer 413. From multiplexer 413 it is sent through multiplexer 418 to an input of OR gate 419, which sends it to the reset terminals of flip-flops 313a-313d. Thus the reset function may be provided by a signal on either product term P12 or product term P19. Alternatively, if the grounded input to multiplexer 418 is selected, the reset signal is delivered from a source outside the arrangement shown in FIG. 4 through the other input to OR gate 419. In that event, product terms P12 and P19 may be used for logic functions.

4. Output Enable

Multiplexer 412 can be programmed so as to pass the signal on product term P19 to line 417. Line 417 is connected to the control terminal of tri-stable buffer 602 in the I/0 cell shown in FIG. 6. In the manner described above, tri-stable buffer 602, depending on the signal on output enable line 417, either functions as a closed switch to allow signals to pass out through I/0 pin 605, or acts as an open switch when pin 605 is used in its input mode.

When not being used to provide an output enable signal, product term P19 may be used to provide a logic function.

5. Function Sharing

As shown in FIG. 4, the respective outputs of OR gates 306a-306d are each connected to an input to a multiplexer 302a-302d in another one of OLMC's 30a-30d. For example, the signal that is fed through array 414 and over line 305b to OLMC 30b is OR'd in OR gate 306b and the output is shared with an input to multiplexer 302a in OLMC 30a. Similarly, the output of OR gate 306c is shared with an input to multiplexer 302b, the output of OR gate 306d is shared with an input to multiplexer 302c, and the output of OR gate 306a is shared with an input to multiplexer 302d.

Figure 7:
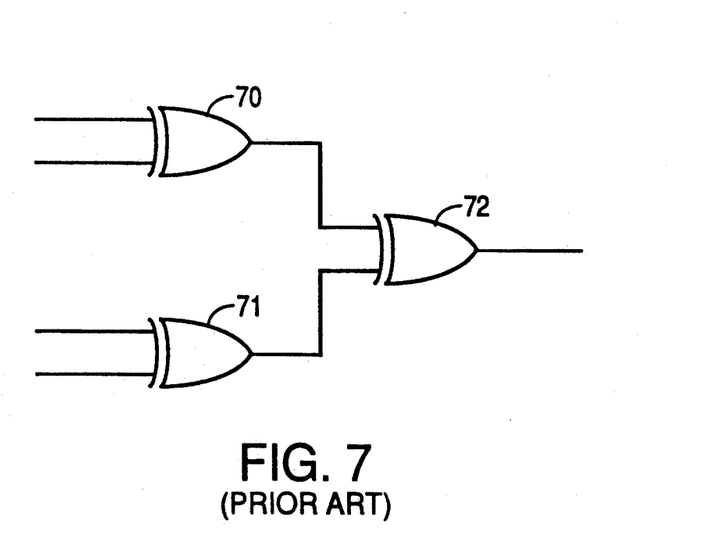
FIG. 7 illustrates a triple XOR gate arrangement which can be emulated by an output logic macrocell of this invention.

When multiplexers 302a-302d and 303a-303d are programmed to allow the shared signals to reach the respective inputs of XOR gates 309a-309d, the shared signal is XOR'd with the signal output from OR gates 306a-306d, respectively. This allows XOR capability between two AND-OR functions from the array 414. For example, the triple XOR gate logic circuit shown in FIG. 7 can be provided by using OR gate 400 and two AND gates, as described above, to simulate XOR gate 70. OR gate 401 is then similarly connected with two AND gates to simulate XOR gate 71, and the output of OR gate 401 is routed through array 414 and over line 305b and through OR gate 306b. From the output of OR gate 306b the signal is directed over line 301a and through multiplexers 302a and 303a to the other input of XOR gate 309a, which functions as XOR gate 72 in FIG. 7.

This capability is extremely useful in performing the XOR functions for such devices as comparators, parity generators, and arithmetic logic write.

6. T and J-K Type Flip-Flops

A T or J-K type flip-flop can be emulated by connecting OR gate 400 with two AND gates to simulate an XOR gate, as described above in connection with FIG. 2. Multiplexer 411 is selected to pass the signal on product term P13 through multiplexers 302a and 303a to the other input of XOR gate 309a. This structure will act as a T or J-K type flip-flop. Alternatively, one of OR gates 401, 403 or 405 and one of multiplexers 407, 408 or 409 can be selected to provide this function.

7. XOR Gate Disable

If multiplexers 303a-303d are programmed to select their grounded inputs, XOR gates 309a-309d are in effect disabled, and pass the signal output of OR gates 306a-306d. This allows the outputs of OR gates 400, 401, 405 and 406 to be OR'd in any combination in OR gates 306a-306d, and provides the capability of performing extremely complex logic functions. For example, all of product terms P0-P19 could be OR'd in a single one of OR gates 306a-306d.

8. Internal Clocking Scheme

Referring to FIGS. 4, 5 and 6, a number of clocking alternatives are available. An asynchronous clock pulse provided by product term P12 can be passed by multiplexers 410, 415 and 416 and used to clock registers 313a-313d. Registers may also be clocked over lines CLK0, CLK1 or CLK2. CLK0 always provides a global clock pulse received by pin Y0 (FIG. 5). Lines CLK1 and CLK2 may be connected to pins Y1 or Y2. Lines CLK1 and CLK2 may also be connected to the $Q_0$ or $Q_1$ outputs of clock logic block 50 by the programmable connections shown in FIG. 5. Thus, registers 303a-303d may receive clock pulses from product term P12, the $Q_0$ or $Q_1$ outputs of logic block 50, or from outside the device (pins Y0, Y1 or Y2).

Register/latch 612 in the input/output cell shown in FIG. 6 may receive clock pulses from outside the device on pines Y2 or Y3 or from outputs $Q_1$, $Q_2$ or $Q_3$ of logic block 50.

9. Bypass Capability

If multiplexers 311—311 are programmed to pass signals from lines 310—310, respectively, OR gates 306—306 and XOR gates 309—309 are bypassed and the signals at the outputs of OR gates 400-403 are transmitted very rapidly to the outputs of OLMC's 30—30. Depending on the status of multiplexers 316—316, these signals can be delivered in either registered or unregistered form.

While certain embodiments of this invention have been described, other embodiments of this invention will be obvious to those skilled in the art in view of this description. Without limiting the generality of the foregoing, it will be understood that the OLMC of this invention may be used in conjunction with any form of logic block, including but not limited to programmable logic arrays (PLA's), programmable array logic/generic array logic circuits (PAL/GAL's), high density programmable logic devices (HDPLD's), field programmable gate arrays (FPGA's), and programmable logic devices (PLD's).

I claim:

1. An output logic macrocell for use with a logic circuit having a plurality of outputs, said macrocell comprising an exclusive OR gate having first and second inputs, said first input being connected to an output of a first OR gate having a plurality of inputs connected to outputs of said logic circuit, and further comprising means for switching said second input of said exclusive OR gate alternatively to an output of said logic circuit or to ground or to an output of a second OR gate having a plurality of inputs connected to outputs of said logic circuit.

2. The macrocell of claim 1 wherein said switching means comprises at least one multiplexer.

3. The macrocell of claim 2 wherein said inputs of said first OR gate are connected to said outputs of said logic circuit through a programmable array.

4. The macrocell of claim 3 comprising means for providing a registered output of said macrocell.

5. The macrocell of claim 4 comprising means for alternatively providing a registered or combinatorial output of said macrocell.

6. The macrocell of claim 4 wherein said means for providing a registered output comprises a register having an input terminal, an output terminal, a clock terminal and a reset terminal.

7. The macrocell of claim 6 wherein said clock terminal is connected to an output of said logic circuit.

8. The macrocell of claim 7 comprising a clock pulse source and means for alternatively switching said clock terminal to an output of said logic circuit or to said clock pulse source.

9. The macrocell of claim 6 wherein said reset terminal is connected to an output of said logic circuit.

10. The macrocell of claim 9 comprising a source of a reset signal and means for alternatively switching said reset terminal to an output of said logic circuit or said source of a reset signal.

11. The macrocell of claim 10 wherein said logic circuit comprises an AND-OR programmable logic array having a plurality of product term lines leading into a plurality of OR gates having respective outputs.

12. The macrocell of claim 9 comprising means for alternatively switching an output of said logic circuit to said clock terminal or to said reset terminal of said register.

13. The output logic macrocell of claim 1 comprising a register connected to an output of said exclusive OR gate, said register having a clock terminal, said clock terminal being connected to an output of a second switching means having a plurality of inputs, at least one of the inputs of said second switching means being connected to an output of said logic circuit, at least one of the inputs of said second switching means being connected to a source of a global clock pulse.

14. The output logic macrocell of claim 1 comprising a register connected to an output of said exclusive OR gate, wherein said register has a reset terminal, said reset terminal being connected to an output of a third OR gate having a plurality of inputs, at least one of the inputs of said third OR gate being connected to an output of said logic circuit, at least one of the inputs of said third OR gate being connected to a source of a global reset pulse.

15. The output logic macrocell of claim 13, said register having a reset terminal, said reset terminal being connected to an output of a third OR gate having a plurality of inputs, at least one of the inputs of said third OR gate being connected to an output of said logic circuit, at least one of the inputs of said third OR gate being connected to a source of a global reset pulse.

16. The output logic macrocell of claim 1 comprising a means for bypassing said exclusive OR gate, said means for bypassing allowing a signal on an output of said logic circuit to pass to an output of said output logic macrocell without passing through said exclusive OR gate.

17. A plurality of the output logic macrocells of claim 2, the second OR gate of a first one of said macrocells being comprised in the first OR gate of a second one of said macrocells.

18. An output logic macrocell for use with a logic circuit having a plurality of outputs, said macrocell comprising an exclusive OR gate having first and second inputs and a register connected to an output of said exclusive OR gate, said register having a clock terminal, said clock terminal being connected to an output of a switching means having a plurality of inputs, at least one of the inputs of said switching means being connected to an output of said logic circuit, at least one of the inputs of said switching means being connected to a source of a global clock pulse.

19. The output logic macrocell of claim 18, said register having a reset terminal, said reset terminal being connected to an output of an OR gate having a plurality of inputs, at least one of the inputs of said OR gate being connected to an output of said logic circuit, at least one of the inputs of said OR gate being connected to a source of a global reset pulse.

20. An output logic macrocell for use with a logic circuit having a plurality of outputs, said macrocell comprising an exclusive OR gate having first and second inputs and a register connected to an output of said exclusive OR gate, said register having a reset terminal, said reset terminal being connected to an output of an OR gate having a plurality of inputs, at least one of the inputs of said OR gate being connected to an output of said logic circuit, at least one of the inputs of said OR gate being connected to a source of a global reset pulse.

21. A programmable logic device comprising a plurality of logic blocks, each of said logic blocks having a plurality of outputs; a plurality of terminals for connecting to external devices; and a clock pulse distribution network, said clock pulse distribution network comprising at least one line for transmitting a clock pulse to a desired location in said programmable logic device and switching means for alternatively connecting said at least one line to at least one of said terminals or to at least one output of at least one of said logic blocks.

22. The programmable logic device of claim 21 wherein said clock pulse distribution network comprises a first line for transmitting a clock pulse to an output logic macrocell and a second line for transmitting a clock pulse to an input/output cell.

23. The programmable logic device of claim 22 wherein said switching means comprises means for connecting at least one of said terminals alternatively to said first line or to said second line or to both said first and second lines.

24. The programmable logic device of claim 22 wherein said switching means comprises means for connecting at least one of the outputs of said logic blocks alternatively to said first line or to said second line or to both said first and second lines.

25. The programmable logic device of claim 23 wherein said switching means comprises means for connecting at least one of the outputs of said logic blocks alternatively to said first line or to said second line or to both said first and second lines.

* * * * *

UNITED STATES PATENT AND TRADEMARK OFFICE
CERTIFICATE OF CORRECTION

PATENT NO.   :   5,191,243
DATED        :   March 2, 1993
INVENTOR(S)  :   Shen et al.

It is certified that error appears in the above-identified patent and that said Letters Patent is hereby corrected as shown below:

In the drawings, Sheet 3, Fig. 4A, and Sheet 4, Fig. 4B, the elements designated by the reference numerals "309a", "309b", "309c" and "309d" should each be represented by the symbol for an exclusive OR gate, as follows:

Signed and Sealed this

Twenty-second Day of February, 1994

Attest:

BRUCE LEHMAN

*Attesting Officer*     *Commissioner of Patents and Trademarks*

UNITED STATES PATENT AND TRADEMARK OFFICE
CERTIFICATE OF CORRECTION

PATENT NO. : 5,191,243
DATED : March 2, 1993
INVENTOR(S) : Shen et al.

It is certified that error appears in the above-indentified patent and that said Letters Patent is hereby corrected as shown below:

Col. 7, line 44, delete "303a-303d" and substitute --313a-313d--.

Col. 7, line 53, delete "311-311" and substitute --311a-311d--.

Col. 7, line 54, delete "310-310" and substitute --310a-310d--.

Col. 7, line 55, delete "306-306" and substitute --306a-306d--; and delete "309-309" and substitute --309a-309d--.

Col. 7, line 57, delete "30-30" and substitute --30a-30d--.

Col. 7, line 58, delete "316-316" and substitute --316a-316d--.

In the drawings, sheet 3, Fig. 4A, the box labeled "MUX" to the right of the box labeled "MUX" numbered "415" should be numbered "416".

Signed and Sealed this

Sixteenth Day of July, 1996

Attest:

BRUCE LEHMAN

*Attesting Officer*     *Commissioner of Patents and Trademarks*